(12) United States Patent
Bhattacharya et al.

(10) Patent No.: US 7,034,653 B2
(45) Date of Patent: Apr. 25, 2006

(54) SEMICONDUCTOR RESISTOR

(75) Inventors: Dipankar Bhattacharya, Macungie, PA (US); John Christopher Kriz, Palmerton, PA (US); Stefan Allen Siegel, Fogelsville, PA (US); Joseph E. Simko, Slatington, PA (US); Yehuda Smooha, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/768,771

(22) Filed: Jan. 30, 2004

(65) Prior Publication Data

US 2005/0168319 A1    Aug. 4, 2005

(51) Int. Cl.
    *H01C 1/01*    (2006.01)
(52) U.S. Cl. .................. 338/322; 338/307; 338/309; 338/324; 338/325; 338/330; 338/333
(58) Field of Classification Search ............. 338/320, 338/260, 325, 295, 306–309, 324, 330, 333
    See application file for complete search history.

(56) References Cited

U.S. PATENT DOCUMENTS

| 5,534,862 | A | | 7/1996 | Gross, Jr. et al. |
| 5,872,504 | A | * | 2/1999 | Greitschus et al. ......... 338/320 |
| 5,977,897 | A | | 11/1999 | Barnes et al. |
| 6,489,881 | B1 | * | 12/2002 | Aleksandravicius et al. ..... 338/307 |
| 6,664,500 | B1 | * | 12/2003 | Wilbur et al. .......... 219/121.69 |
| 2004/0056756 | A1 | * | 3/2004 | Dempsey .................... 338/320 |

* cited by examiner

*Primary Examiner*—Tu Hoang

(57) ABSTRACT

A semiconductor resistor comprises a resistor body formed on a semiconductor substrate and first and second conductive terminals electrically connected to the resistor body at opposite ends thereof. The semiconductor resistor further includes at least first and second conductive paths between at least one of the first and second conductive terminals and the resistor body. The at least one conductive terminal is configured such that a resistance of the at least one conductive terminal between the at least first and second conductive paths is substantially matched to a resistance of the resistor body between the at least first and second conductive paths. In this manner, a current distribution between the at least first and second conductive paths is substantially matched.

17 Claims, 5 Drawing Sheets

SEMICONDUCTOR RESISTOR

FIELD OF THE INVENTION

The present invention relates generally to semiconductor devices, and more particularly relates to techniques for forming a semiconductor resistor having improved reliability.

BACKGROUND OF THE INVENTION

A semiconductor resistor, as may be fabricated in an integrated circuit (IC) device, typically comprises a body portion formed of a material having a predetermined resistivity, often stated in units of ohms per square, associated therewith. Electrical connection to the body portion is generally provided by a plurality of metal contacts formed at opposite ends of the resistor body. The contacts at the ends of the resistor body may be connected to metal terminals for providing electrical interconnection with other components and/or structures in the IC device.

Since the metal terminals connected to the contacts at each end of the semiconductor resistor are generally of significantly lower resistance in comparison to the resistance of the resistor body itself, a majority of the current passing through the metal terminals of the resistor flows through an inner row of contacts, which represents a path of least resistance. This unequal current distribution in the semiconductor resistor often results in localized heating and electromigration, particularly in the contact regions of the resistor. Electromigration is a well-known reliability problem which generally involves the movement of atoms in a metal interconnection line due to momentum transfer from conduction electrons. The metal atoms migrate in the direction of current flow and can eventually lead to a complete or partial failure of the metal interconnection line. Electromigration may be due to diffusion in a substrate of the semiconductor material, diffusion in grain boundaries, or diffusion on a surface of the material.

Conventionally, in order to meet certain contact electromigration limit specifications, an IC designer is required to increase a length and/or width of the semiconductor resistor and provide additional rows of contacts. However, increasing the number of rows of contacts does not solve the inherent unequal current distribution problem in the resistor, and thus a majority of the current will continue to flow through an inner row of the contacts. Moreover, increasing the dimensions of the semiconductor resistor undesirably increases the overall area consumed by the IC device.

There exists a need, therefore, for an improved semiconductor resistor arrangement that does not suffer from one or more of the problems exhibited by conventional resistor structures. Furthermore, such an improved semiconductor resistor should be substantially compatible with conventional semiconductor fabrication processes.

SUMMARY OF THE INVENTION

The present invention meets the above-noted need by providing, in an illustrative embodiment, techniques for forming an improved semiconductor resistor structure which advantageously provides a substantially uniform current distribution in one or more contact regions of the resistor.

In accordance with one aspect of the invention, a semiconductor resistor comprises a resistor body formed on a semiconductor substrate and first and second conductive terminals electrically connected to the resistor body at laterally opposite ends of the resistor body. At least one of the first and second conductive terminals comprises a plurality of conductive paths between the at least one conductive terminal and the resistor body. A first one of the conductive paths includes a first row of contacts for providing electrical connection between the at least one conductive terminal and the resistor body, and a second one of the conductive paths includes a second row of contacts for providing electrical connection between the at least one conductive terminal and the resistor body. The first and second rows of contacts are spaced laterally apart in relation to one another. The at least one conductive terminal is configured such that a resistance of the at least one conductive terminal between the first and second conductive paths is substantially matched to a resistance of the resistor body between the first and second rows of contacts.

In accordance with another aspect of the invention, the resistance of the at least one conductive terminal between the first and second conductive paths is substantially matched to a resistance of the resistor body between the first and second rows of contacts by including a resistive element connected between the first and second conductive paths in the at least one conductive terminal. The resistive element preferably includes a plurality of alternating higher level and lower level conductors connected together by a plurality of conductive vias to form a series chain structure. The plurality of alternating higher level and lower level conductors is formed substantially above at least a portion of the resistor body.

In the illustrative embodiment of the invention, a terminal conductor, which provides electrical connection between the semiconductor resistor and at least one other circuit component and/or structure in an IC device, is configured such that a resistance of the terminal conductor between at least two contacts connecting the terminal conductor to a resistor body portion is substantially matched to a resistance of the resistor body between the at least two contacts. Since current will divide among two or more conductive paths according to the resistance associated with each path, by providing substantially equal resistance paths, the current distribution in the contact paths will also be substantially equal to one another. Thus, electromigration and/or localized heating in the semiconductor resistor is beneficially reduced, without significantly increasing semiconductor area and/or cost.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative semiconductor resistor structure. It should be understood, however, that the present invention is not limited to this or any particular resistor arrangement. Rather, the invention is more generally applicable to techniques for improving a reliability of a semiconductor resistor by beneficially providing a substantially uniform current distribution in a contact region of the semiconductor resistor.

Figure 1A:
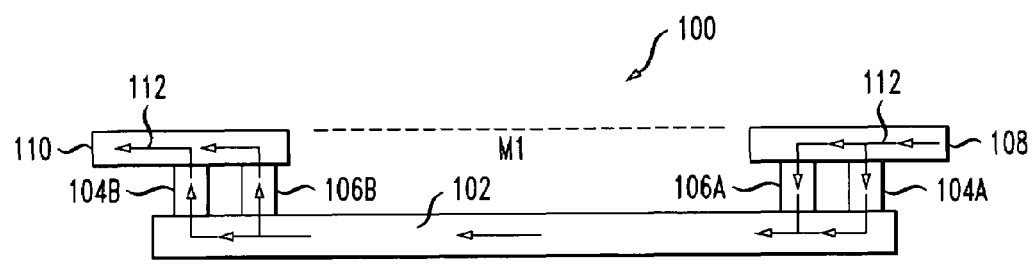
FIGS. 1A and 1B are a cross-sectional views depicting at least a portion of a semiconductor resistor which can be modified to implement the techniques of the present invention.

FIG. 1A depicts a cross section of an illustrative semiconductor resistor 100 which can be modified to implement the techniques of the present invention. The illustrative semiconductor resistor 100 includes a resistor body 102, a first conductive terminal 108 and a second conductive terminal 110. The first and second conductive terminals 108, 110 are electrically connected to the resistor body 102, at laterally opposite ends thereof, by two rows of contacts 104A, 106A and 104B, 106B, respectively. Contacts in row 106A of terminal 108 maybe referred to herein as an inner row of contacts, since they are closest to an inner region of the resistor body. Likewise, contacts in row 106B of terminal 110 may be referred to as an inner row of contacts.

The resistor body 102 may comprise, for example, polycrystalline silicon (polysilicon) which is either silicided or unsilicided, as will be known by those skilled in the art. A terminal portion of the resistor body, which may define a region wherein the contacts 104A, 104B, 106A, 106B are formed, is typically silicided for providing a suitable ohmic connection between the silicon of the resistor body and the amorphous metal of the contact. The resistor body 102 has a certain resistance value associated therewith which is determined primarily by a resistivity of the material used to form the resistor body (e.g., polysilicon), usually noted in units of ohms per square, as well as the dimensions (e.g., length and width) of the resistor body itself. The conductive terminals 108, 110 and contacts 104A, 104B, 106A, 106B are typically comprised of a metal (e.g., aluminum) having a significantly lower resistivity associated therewith compared to the resistivity of the resistor body 102. Conductive terminals 108, 110 may be formed in a first metal layer (M1) using a conventional IC fabrication process.

Assume that a current 112 flows through the semiconductor resistor 100 by entering first terminal 108. As the current 112 approaches the second row of contacts 104A, the current will divide. A portion of the current 112 will flow through a first conductive path comprising terminal 108, contacts 104A and resistor body 102, while the remaining portion of the current will flow through a second conductive path comprising terminal 108, inner row of contacts 106A and the resistor body 102. The current contributions through the first and second conductive paths will then combine after passing the inner row contacts 106A to form the original current 112, which flows through resistor body 102 to the second conductive terminal 110. The current 112 will then divide between the contacts 104B, 106B connected to the second conductive terminal 110 and then combine in the second terminal in a manner similar to that previously described in conjunction with the first conductive terminal 108.

The respective portions of current 112 flowing through the first and second conductive paths will typically not be the same. As previously explained, the current 112 will divide according to a resistance associated with each of the first and second conductive paths. Since a resistance of the resistor body portion between the second and inner row contacts 104A, 106A will be significantly greater than a resistance of the portion of the terminal 108 between the second and inner row contacts, the first conductive path will have a significantly higher resistance compared to the second conductive path. Consequently, a much greater percentage of the total current 112 will flow through the second conductive path compared to the first conductive path.

Figure 2:
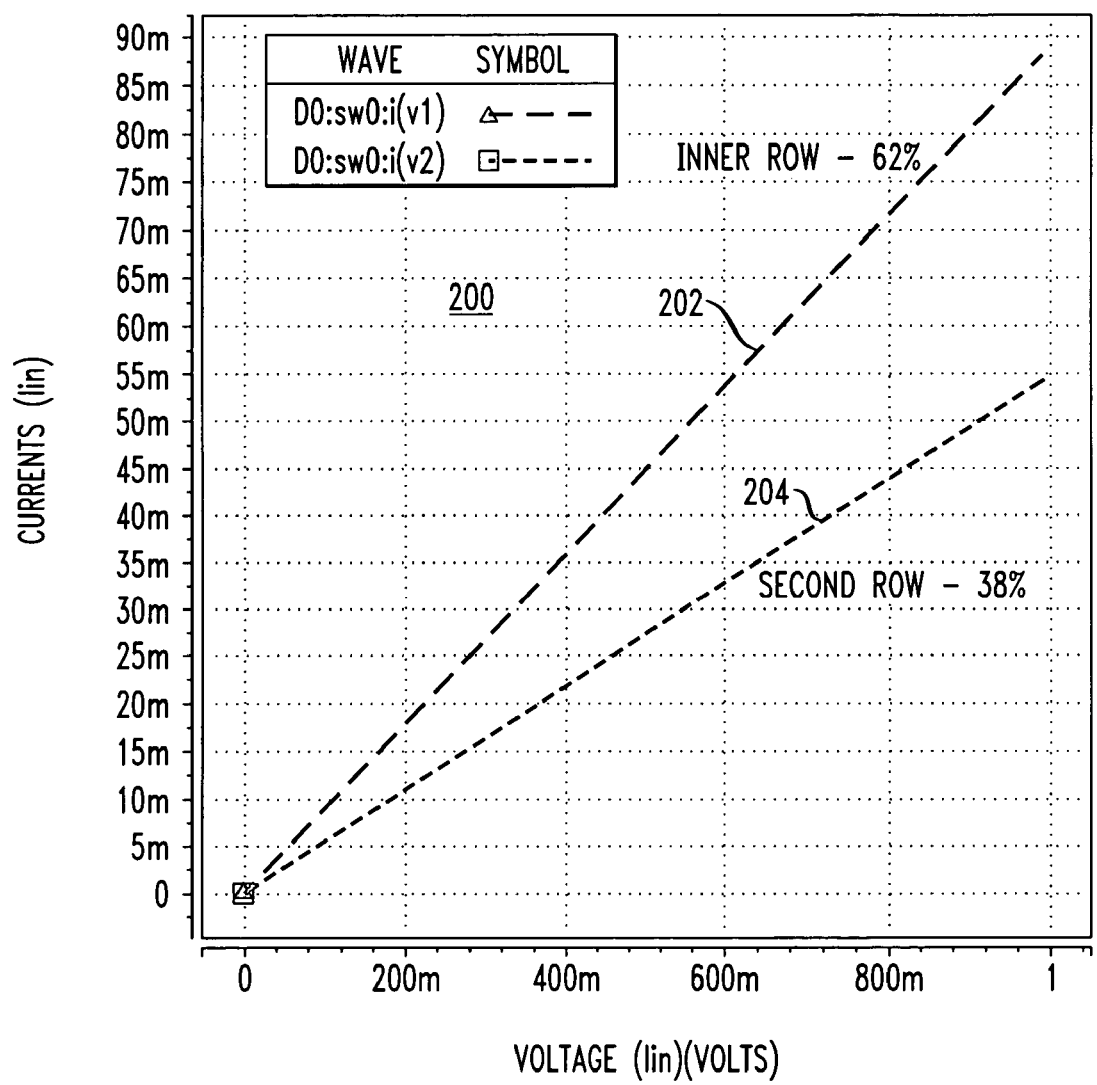
FIG. 2 is a graphical illustration depicting a simulated current distribution in the contacts of the semiconductor resistor shown in FIG. 1A.

For illustration purposes only, a resistance of the terminal portion (silicided) of the resistor body 102 may be about 7 ohms per square, a sheet resistance of the terminals 108, 110 formed in the first metal layer (M1) may be about 0.09 ohms, a contact resistance between the first metal layer terminals and the silicided polysilicon may be about 11 ohms, and a resistance of a contact (e.g., in a given row of contacts 104A, 104B, 106A, 106B) may be about 0.7 ohms. Using the above exemplary resistance values, FIG. 2 is a graphical representation 200 depicting simulation results which illustrate the amount of current flowing through the two rows of contacts (e.g., 104A, 106A). Line 202 represents a simulation of the current flowing through the inner row of contacts 106A or 106B and line 204 represents the simulated current flowing through the second row of contacts 104A or 104B. As apparent from the figure, the current flowing through the inner row of contacts 106A, 106B is estimated to be about 62 percent (%), while the current flowing through the second row of contacts 104A, 104B is only estimated to be about 38%. This unequal current distribution between the two rows of contacts in the semiconductor resistor 100 can lead to electromigration which may result in semiconductor resistor device failure, as previously stated.

Figure 1B:
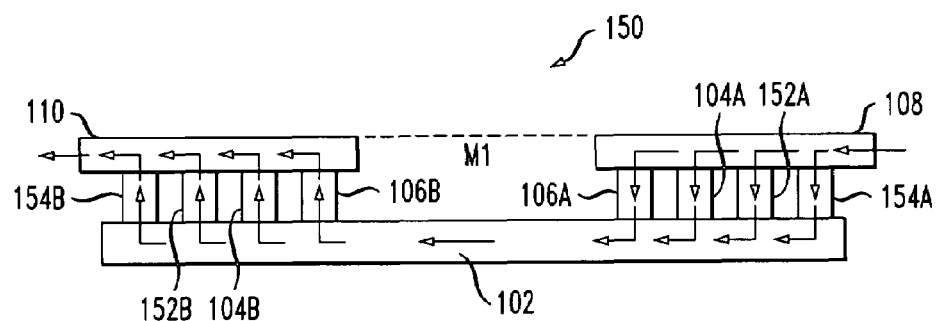

In an attempt to solve the electromigration problem in semiconductor resistors, designers often include additional rows of contacts for providing electrical connection to the resistor. For example, FIG. 1B depicts a cross section of an illustrative semiconductor resistor 150 including the resistor body 102 and four rows of contacts at laterally opposite ends of the resistor body 102, including the inner row of contacts 106A/106B, the second row of contacts 104A/104B, as well as third and fourth rows of contacts 152A/152B and 154A/154B, respectively. However, since the resistivity of the metal terminals 108, 110 is substantially lower than the resistivity of the terminal portions of the resistor body, a majority of the current will continue to flow through the inner row of contacts 106A. 106B, taking the path of least resistance.

Figure 1C:
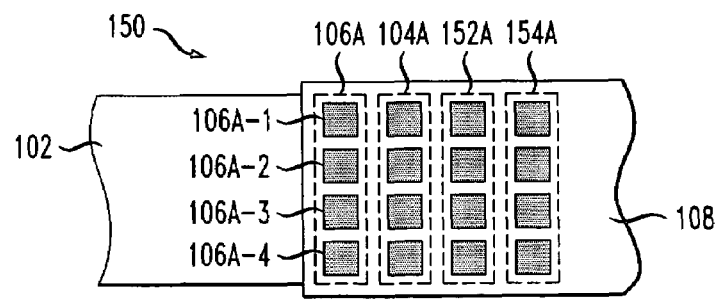

FIG. 1C is a top plan view illustrating at least a portion of the resistor 150 shown in FIG. 1B, depicting terminal 108 and the four rows of contacts 106A, 104A, 152A, 154A corresponding thereto. As apparent from the figure, any given row of contacts, such as, for example, row 106A, may include multiple contacts 106A-1, 106A-2, 106A-3, 106A-4, as maybe determined, at least in part, by a width of the resistor body 102, to provide a sufficient electrical connection between the terminal 108 and the resistor body 102. Likewise, it is contemplated that any given row may include a single contact.

Figure 3:
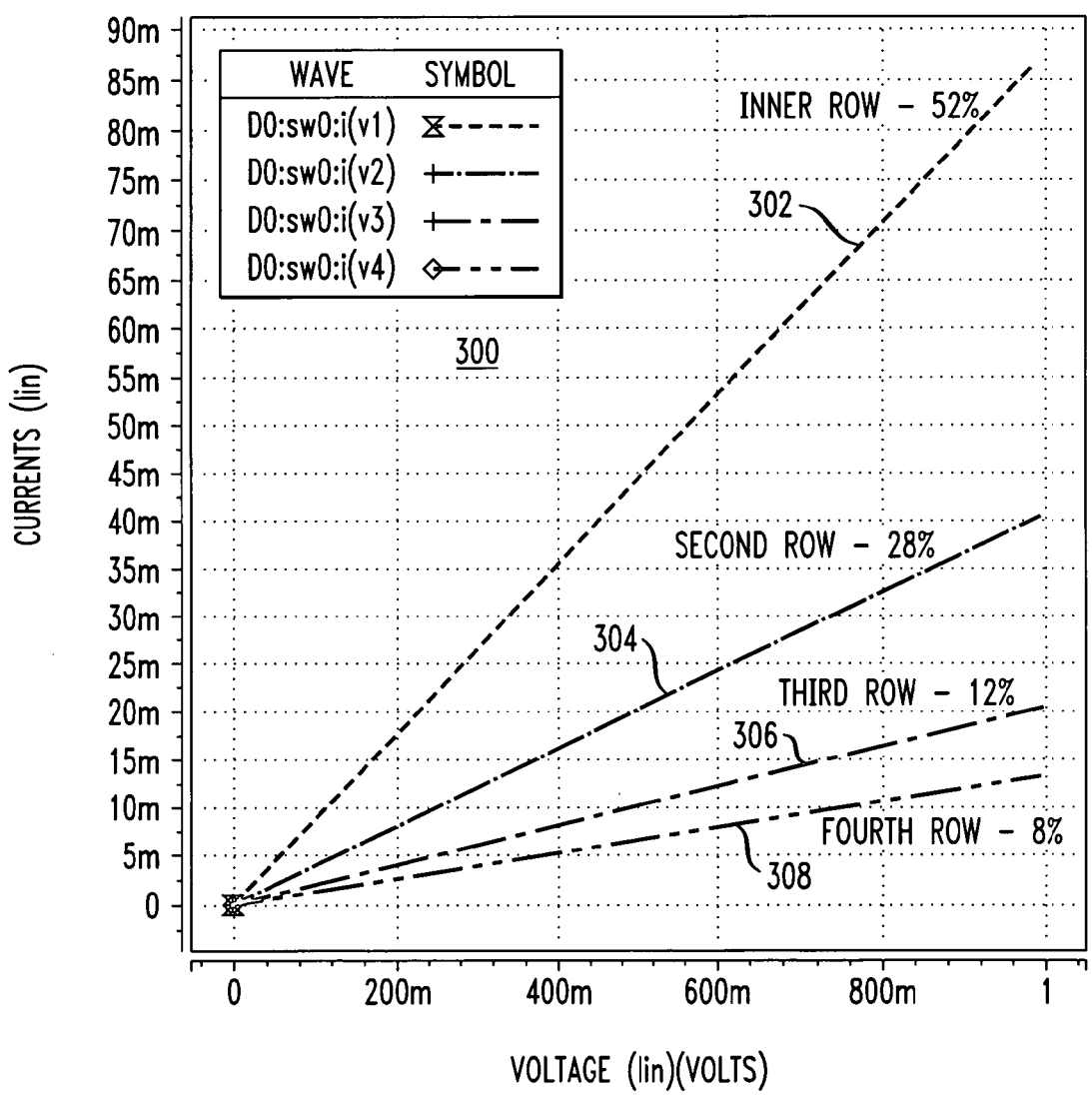
FIG. 3 is a graphical illustration depicting a simulated current distribution in the contacts of the semiconductor resistor shown in FIG. 1B.

By way of example, FIG. 3 is a graphical representation 300 depicting simulation results which illustrate the amount of current flowing through the four rows of contacts 104A, 106A, 152A, 154A, associated with terminal 108 of the semiconductor resistor 150 shown in FIG. 1B, using the above exemplary resistance values. In the graphical representation 300, line 302 represents the current flowing through the inner row of contacts 106A, line 304 represents the current flowing through the second row of contacts 104A, line 306 represents current flowing through the third row of contacts 152A, and line 308 represents current flowing through the fourth row of contacts 154A. As shown in the figure, about 52% of the total current is predicted to flow through the inner row of contacts, while only about 28%, 12%, and 8% of the total current is predicted to flow through the second, third and fourth row of contacts, respectively. It is assumed that the current division shown in FIG. 3 is the same in terminal 110 as it is in terminal 108. As apparent from the figure, merely including additional rows of contacts in the semiconductor resistor does not provide an acceptable solution to the current distribution problem in the resistor.

Figure 4:
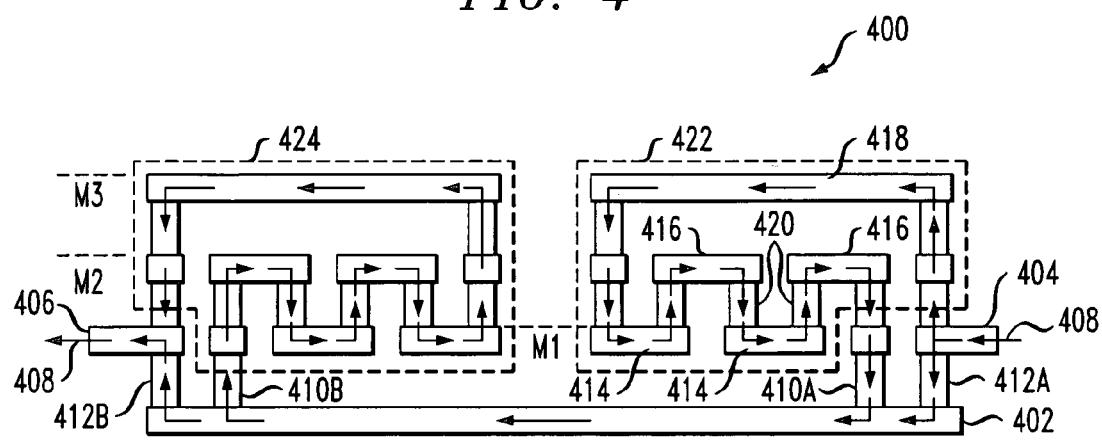
FIG. 4 is a cross-sectional view depicting at least a portion of an exemplary semiconductor resistor, formed in accordance with one embodiment of the present invention.

FIG. 4 illustrates a cross section of an exemplary semiconductor resistor 400 which provides improved current distribution, in accordance with one embodiment of the present invention. The exemplary semiconductor resistor 400 includes a resistor body 402, a first conductive terminal 404 and a second conductive terminal 406. The first and second conductive terminals 404, 406 are electrically connected to the resistor body 402, such as, for example, at laterally opposite ends of the resistor body, by a plurality of rows of contacts 410A, 412A and 410B, 412B, respectively. In the exemplary semiconductor resistor 400, two rows of contacts 410A/412A and 410B/412B are employed at each end of the resistor. It is to be understood, however, that the invention is not limited to a particular number of rows of contacts, nor is the invention limited to the number of contacts in any particular row. For example, one or more rows of contacts may be selected based, at least in part, on an anticipated amount of current flowing through the resistor. Likewise, one or more contacts may be included a given row based, at least in part, on a width of the resistor. Furthermore, the number of rows of contacts associated with each terminal of the resistor need not be the same.

Row of contacts 410A, 410B may be referred to herein as an inner row of contacts, since they are closest to an inner region of the resistor body 402, while row of contacts 412A, 412B may be referred to as a second row of contacts. Each of the contacts in a given row 410A, 410B, 412A, 412B preferably comprises a conductive via, as are traditionally used to electrically connect conductors formed in two different metal layers (e.g., metal 1 and metal 2 layers) in an IC device. The resistor body 402, which is preferably formed on a semiconductor substrate (not shown), may comprise, for example, polycrystalline silicon (polysilicon) material which can be silicided or unsilicided, as will be known by those skilled in the art. Silicided polysilicon has a lower resistivity associated therewith as compared to unsilicided polysilicon. Alternatively, the resistor body may comprise silicon material that is doped with an impurity (e.g., an n-type or p-type impurity) of a desired concentration level. Like the polysilicon material, the doped silicon may be silicided or unsilicided. A terminal portion of the resistor body, which may be referred to herein as a region of the resistor body proximate the rows of contacts 410A, 410B, 412A, 412B, is typically silicided for providing a suitable ohmic connection between the resistor body material and the metal contacts. The resistor body 402 has a certain resistance value associated therewith that is determined primarily by a resistivity of the material used to form the resistor body (e.g., polysilicon, doped silicon, etc.), usually noted in units of ohms per square, as well as the geometry and/or dimensions (e.g., shape, length and width) of the resistor body itself. The conductive terminals 404, 406 and corresponding rows of contacts 410A, 410B, 412A, 412B are preferably comprised of a metal (e.g., aluminum, gold, etc.), or an alternative conductive material, having a significantly low resistivity (e.g., about $10^{-8}$ ohm-meter) associated therewith, particularly compared to the resistivity of the resistor body 402.

As previously noted in connection with FIGS. 1A and 1B, when using multiple rows of contacts 410A/412A, 410B/412B to electrically connect a given conductive terminal 404, 406, respectively, to the resistor body 402, multiple current paths are established. In a traditional semiconductor resistor structure, the portions of the total current flowing in these respective current paths are generally not uniform, thereby increasing the likelihood that electromigration will occur. The present invention advantageously reduces the possibility for the occurrence of electromigration, in at least one aspect, by providing a semiconductor resistor structure wherein the respective portions of current flowing through each row of contacts (e.g., 410A, 412A) associated with a given terminal (e.g., 404) are substantially matched to one another so as to generate a uniform current distribution in the resistor 400. This may be accomplished, in an illustrative embodiment of the invention, by configuring at least one of the conductive terminals, such as terminal 404, of the exemplary semiconductor resistor 400 such that a resistance of the conductive terminal measured between the inner row of contacts 410A and the second row of contacts 412A is substantially matched to a resistance of the resistor body 402 measured between the two rows of contacts 410A and 412A.

As previously explained, the resistivity of the conductive material (e.g., aluminum) forming the conductive terminals 404, 406 is typically substantially less than the resistivity of the material (e.g., polysilicon) forming the resistor body 402. As a result of the difference in resistivity between the two types of materials, a resistance of a first conductive path comprising the second row of contacts 412A, 412B will be greater than a resistance of a second conductive path comprising the inner row of contacts 410A, 410B. In order to compensate for this difference in resistance between the two conductive paths, resistance is preferably added in series with the second conductive path, through the inner row of contacts, such as, for example, by increasing a length of the corresponding conductive terminal portion connecting the two rows of contacts 410A and 412A, corresponding to terminal 404, or rows 410B and 412B, corresponding to terminal 406. However, since the resistivity of the conductive material forming the conductive terminals 404, 406 is so low (e.g., about 0.05 ohms per square), the amount of additional semiconductor area required to fabricate a resistor having a substantially uniform current distribution would be undesirably large using a single metal layer.

Using conductive terminal 404 as an example, in accordance with one aspect of the present invention, in order to increase the resistance in the second conductive path without significantly increasing the required semiconductor area, at least a portion of conductive terminal 404 between the inner row and second row of contacts 410A and 412A preferably comprises a series chain structure 422 of a desired length. A first end of the chain structure 422 is preferably connected to the corresponding inner row of contacts 410A and a second end of the chain is connected to a junction of the conductive terminal 404 and the corresponding second row of contacts 412A. The second end of the chain structure 422 may be connected to the conductive terminal 404 by a conductor 418 which is preferably formed, for example, in a separate metal layer (e.g., a third metal layer (M3)) so as to avoid electrically shorting any portion of the chain. In a preferred embodiment of the invention, the conductive terminal 404 is configured such that the alternating chain structure 422 is formed substantially above and proximate to the resistor body 402, and thus no additional semiconductor area is required to fabricate the resistor 400. The invention contemplates that a similar series chain structure 424 may be connected between the two rows of contacts 410B and 412B corresponding to terminal 406.

Although the present invention is not limited to any specific semiconductor structure used to add series resistance to the portion of the conductive terminal 404 between the two rows of contacts 410A, 412A, an illustrative chain structure 422 will be described herein. The exemplary chain structure 422 preferably comprises a plurality of alternating first metal layer (M1) conductors 414 and second metal layer (M2) conductors 416, connected together by conductive vias 420 formed between the metal layers. Alternatively, the alternating conductors 414, 416 may be formed in any two metal layers (e.g., layers M2 and M3). Each conductive via 420 is preferably connected to a higher metal layer conductor (e.g., 416) at a first end of the via and to a lower metal layer conductor (e.g., 414) at a second end of the via. As in a conventional multiple metal layer fabrication process, the various metal layers (e.g., M1, M2, M3) are generally separated from one another by one or more insulating layers (not shown), which may comprise, for example, an oxide or nitride (e.g., silicon dioxide, silicon nitride, etc.), as will be understood by those skilled in the art. By forming at least a portion of the conductive terminal 404 in this manner, a resistance of the terminal between the two rows of contacts 410A, 412A can be beneficially increased, without consuming significant additional semiconductor area.

The length of the chain structure 422, which may be determined by the number and/or length of the conductors 414, 416 forming the chain, is based primarily on the desired resistance to be added to the corresponding conductive path. Since the resistance of a conductive via 420 (e.g., about 0.7 ohms) is substantially higher than the sheet resistance of a conductor 414, 416 (e.g., about 0.05 ohms per square), the resistance of the conductive terminal 404 between the two rows of contacts 410A, 412A is determined primarily by the resistance of the conductive vias 420 associated with the chain structure 422. Therefore, the number and/or length of the conductors employed in the chain structure 422 can be beneficially reduced by increasing the number of conductive vias 420 used in the chain, thereby providing a further savings in semiconductor area.

As previously stated, the present invention contemplates that the chain structure 422, used for matching the resistance of a given terminal conductor 404, 406 between two rows of contacts (e.g., 410A, 412A) with the resistance of the resistor body 402 between the same two rows of contacts, may be formed using alternative arrangements. Some illustrative techniques for forming precisely defined semiconductor resistors are described, for example, in U.S. Pat. No. 5,534,862 to Gross, Jr. et al. and U.S. Pat. No. 5,977,897 to Barnes et al., each of which are incorporated by reference herein.

Figure 5:
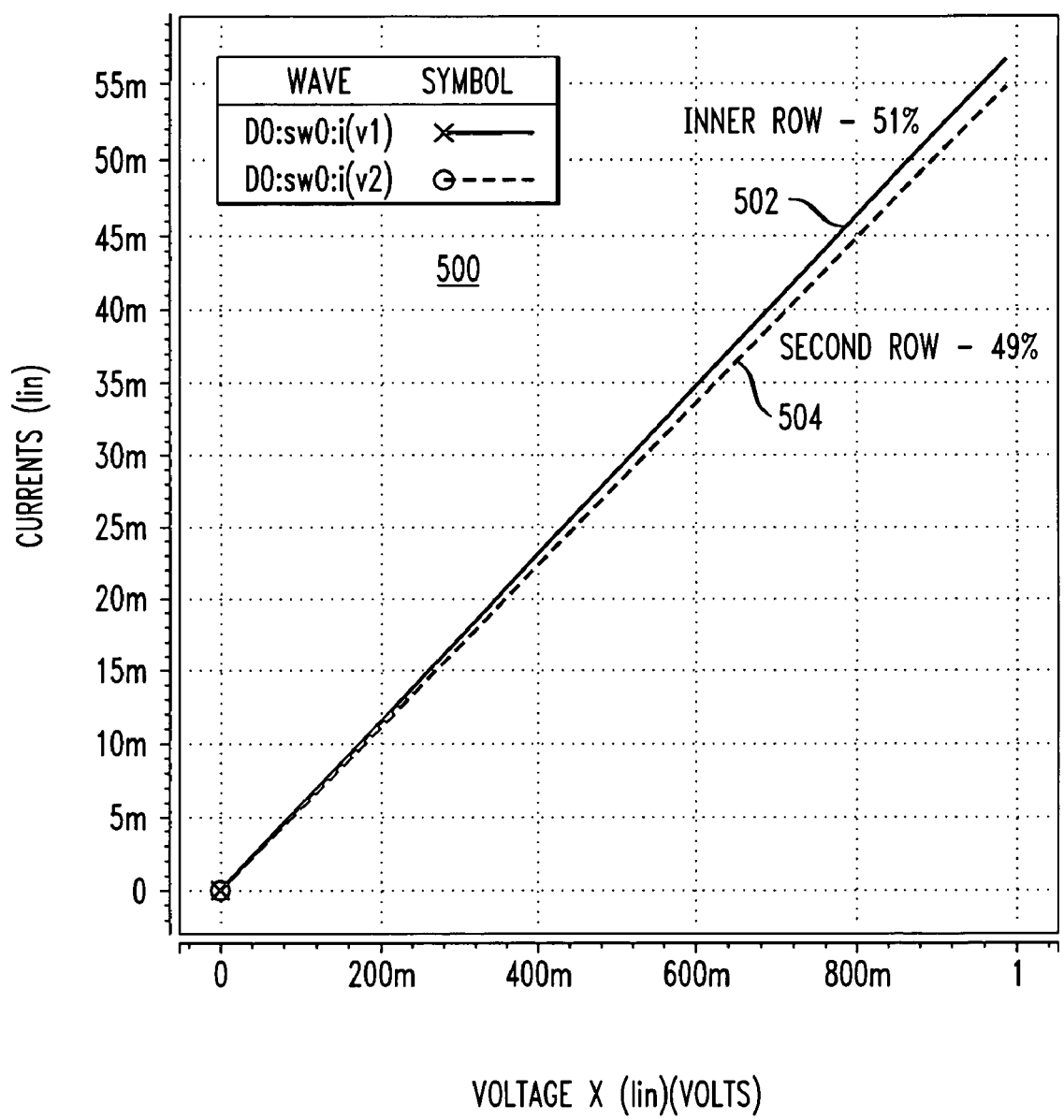
FIG. 5 is a graphical illustration depicting a simulated current distribution in the contacts of the semiconductor resistor shown in FIG. 4.

FIG. 5 is a graphical representation 500 presenting exemplary simulation results which illustrate the amount of current flowing through the two rows of contacts 410, 412 of the semiconductor resistor 400 shown in FIG. 4, using the above exemplary resistance values. In the graphical representation 500, line 502 represents the current flowing through the inner row of contacts 410A, 410B and line 504 represents the current flowing through the second row of contacts 412A, 412B associated with a given conductive terminal 404, 406, respectively. As apparent from the figure, about 51% of the total current is predicted to flow through the inner row of contacts, while about 49% of the total current is predicted to flow through the second row of contacts. Therefore, using the techniques of the present invention, a substantially matched current distribution is provided in the semiconductor resistor 400, thereby reducing the likelihood that electromigration will occur in the resistor.

Figure 6:
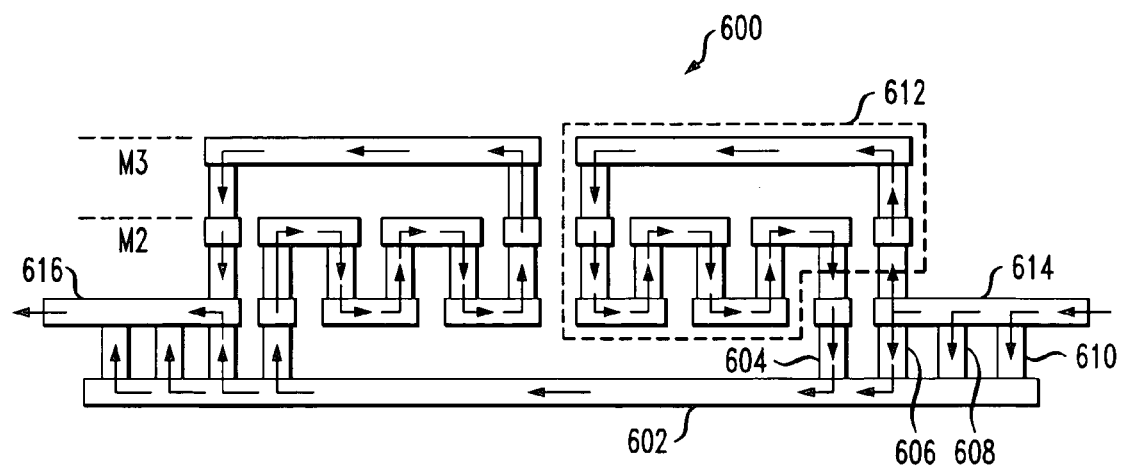
FIG. 6 is a cross-sectional view depicting at least a portion of a semiconductor resistor, formed in accordance with another embodiment of the present invention.

As previously stated, the present invention is not limited to the number of rows of contacts used. FIG. 6 illustrates an exemplary semiconductor resistor 600, formed in accordance with another embodiment of the invention, which includes two conductive terminals 614 and 616 connected to a resistor body 602 at laterally opposite ends of the resistor body by four rows of contacts. As in the exemplary resistor 400 previously described in conjunction with FIG. 4, conductive terminals 614 and 616 provide electrical connection to the resistor 600. For a given one of the conductive terminals, for example, terminal 614, the rows of contacts may be defined herein as comprising an inner row of contacts 604, a second row of contacts 606, a third row of contacts 608, and a fourth row of contacts 610. To is to be appreciated that the semiconductor resistor 600 is not limited to a particular number of rows of contacts employed. Moreover, any given row of contacts may comprise one or more contacts therein, as previously explained in conjunction with FIG. 1C. Additionally, while it is preferable to use the same number of rows of contacts at both ends of the resistor body 602, the present invention is not limited to this configuration. It is contemplated that a different number of rows of contacts may be associated with conductive terminal 614 compared to conductive terminal 616. This assumption holds true for any embodiment of the present invention.

As depicted in FIG. 3, which illustrates the predicted current distribution in a typical semiconductor resistor including four rows of contacts, the portion of the total current flowing through the inner row of contacts (e.g., 52%) is substantially greater compared to the portion of the total current flowing through the second, third or fourth rows of contacts (e.g., 28%, 12% and 8%, respectively). Therefore, the current distribution in the exemplary semiconductor resistor 600 can be made substantially more uniform by adding series resistance to one or both conductive terminals 614, 616, between the inner row of contacts 604 and second row of contacts 606, the series resistance being substantially matched to a resistance of the resistor body 602 between the two rows of contacts 604, 606. This may be accomplished, for example, by configuring the corresponding conductive terminal to include series chain structure 612, or an alternative resistive element, connected between the inner and second rows of contacts, as shown in FIG. 6. The chain structure 612 may be formed in a manner similar to the chain structure 422 shown in FIG. 4, although alternative structures may be used having a resistance associated therewith which is substantially matched to the resistance of the resistor body 602 between the inner row of contacts 604 and second row of contacts 606, as previously explained.

It is to be appreciated that further beneficial matching of the current distribution among the multiple rows of contacts 604, 606, 608 610 may be obtained by matching the resistance of one or both conductive terminals 614, 616 between any two rows of contacts (e.g., 606 and 608, 608 and 610, etc.) with the resistance of the resistor body 602 between corresponding rows of contacts, in accordance with another aspect of the invention. For instance, conductive terminal 614 may be further configured such that a resistance of the conductive terminal between the second row of contacts 606 and third row of contacts 608 is substantially matched to the resistance of the resistor body 602 between the same two rows of contacts.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A semiconductor resistor, comprising:
   a resistor body formed on a semiconductor substrate;
   first and second conductive terminals electrically connected to the resistor body at opposite ends thereof; and
   at least first and second conductive paths between at least one of the first and second conductive terminals and the resistor body;
   wherein the at least one conductive terminal is configured such that a resistance of the at least one conductive terminal between the at least first and second conductive paths is substantially matched to a resistance of the resistor body between the at least first and second conductive paths; and
   wherein at least one of the at least first and second conductive paths comprises a resistive element connected between the at least one conductive terminal and the resistor body, the resistive element being separate from the resistor body.

2. The semiconductor resistor of claim 1, wherein a given one of the at least first and second conductive paths comprises one or more contacts.

3. The semiconductor resistor of claim 1, wherein a given one of the at least first and second conductive paths comprises a row of contacts.

4. The semiconductor resistor of claim 1, wherein the resistive element has a resistance associated therewith that is substantially equal to the resistance of the resistor body between the at least first and second conductive paths.

5. The semiconductor resistor of claim 4, wherein the resistive element is formed above and proximate to at least a portion of the resistor body.

6. A semiconductor resistor, comprising:
   a resistor body formed on a semiconductor substrate;
   first and second conductive terminals electrically connected to the resistor body at opposite ends thereof; and
   at least first and second conductive paths between at least one of the first and second conductive terminals and the resistor body;
   wherein the at least one conductive terminal is configured such that a resistance of the at least one conductive terminal between the at least first and second conductive paths is substantially matched to a resistance of the resistor body between the at least first and second conductive paths; and
   wherein at least one of the least first and second conductive paths comprises a resistive element connected between the at least one conductive terminal and the resistor body, the resistive element including a plurality of alternating higher level and lower level conductors connected together by a plurality of conductive vias to form a series chain structure, a resistance of the resistive element being substantially matched to the resistance of the resistor body between the at least first and second conductive paths.

7. The semiconductor resistor of claim 6, wherein a resistance of the series chain structure is determined, at least in part, by at least one of a number of higher level and lower level conductors in the chain structure and one or more characteristics associated with the higher level and lower level conductors.

8. The semiconductor resistor of claim 7, wherein the one or more characteristics associated with the higher level and lower level conductors in the chain structure comprises at least one of a resistivity of the higher level and lower level conductors and at least one dimension associated with the higher level and lower level conductors.

9. The semiconductor resistor of claim 6, wherein the higher level conductors are formed in a second metal layer and the lower level conductors are formed in a first metal layer, the first and second metal layers being separated from one another by at least one insulating layer.

10. The semiconductor resistor of claim 6, wherein the chain structure is formed above and proximate to the resistor body.

11. The semiconductor resistor of claim 1, wherein for each of the first and second conductive terminals, a resistance of the conductive terminal between corresponding at least first and second conductive paths is substantially matched to a resistance of the resistor body between the corresponding at least first and second conductive paths.

12. The semiconductor resistor of claim 1, wherein the resistor body comprises polysilicon and at least one of the conductive terminals comprises a metal.

13. An integrated circuit including at least one semiconductor resistor, the at least one semiconductor resistor comprising:
   a resistor body formed on a semiconductor substrate;
   first and second conductive terminals electrically connected to the resistor body at opposite ends thereof; and
   at least first and second conductive paths between at least one of the first and second conductive terminals and the resistor body;
   wherein the at least one conductive terminal is configured such that a resistance of the at least one conductive terminal between the at least first and second conductive paths is substantially matched to a resistance of the resistor body between the at least first and second conductive paths; and
   wherein at least one of the at least first and second conductive paths comprises a resistive element connected between the at least one conductive terminal and the resistor body, the resistive element being separate from the resistor body.

14. The integrated circuit of claim 13, wherein at least one of the at least first and second conductive paths comprises a resistive element connected between the at least one conductive terminal and the resistor body, the resistive element having a resistance associated therewith that is substantially equal to the resistance of the resistor body between the at least first and second conductive paths.

15. An integrated circuit including at least one semiconductor resistor, the at least one semiconductor resistor comprising:
   a resistor body formed on a semiconductor substrate;
   first and second conductive terminals electrically connected to the resistor body at opposite ends thereof; and
   at least first and second conductive paths between at least one of the first and second conductive terminals and the resistor body;
   wherein the at least one conductive terminal is configured such that a resistance of the at least one conductive terminal between the at least first and second conductive paths is substantially matched to a resistance of the resistor body between the at least first and second conductive paths; and
   wherein at least one of the at least first and second conductive paths comprises a resistive element connected between the at least one conductive terminal and the resistor body, the resistive element including a plurality of alternating higher level and lower level conductors connected together by a plurality of conductive vias to form a series chain structure, a resistance of the resistive element being substantially matched to the resistance of the resistor body between the at least first and second conductive paths.

16. The integrated circuit of claim 15, wherein a resistance of the series chain structure is determined, at least in part, by at least one of a number of higher level and lower level conductors in the chain structure and one or more characteristics associated with the higher level and lower level conductors.

17. The integrated circuit of claim 16, wherein the one or more characteristics associated with the higher level and lower level conductors in the chain structure comprises at least one of a resistivity of the higher level and lower level conductors and at least one dimension associated with the higher level and lower level conductors.

* * * * *